US008665012B2

(12) United States Patent
Grozinger et al.

(10) Patent No.: US 8,665,012 B2
(45) Date of Patent: Mar. 4, 2014

(54) ANALOG FILTER WITH ADJUSTABLE FILTER FREQUENCY

(75) Inventors: Roland Grozinger, Heitersheim (DE); Arnd Kempa, Steinen (DE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 0 days.

(21) Appl. No.: 13/376,758

(22) PCT Filed: Apr. 23, 2010

(86) PCT No.: PCT/EP2010/055447
§ 371 (c)(1),
(2), (4) Date: Feb. 17, 2012

(87) PCT Pub. No.: WO2010/142487
PCT Pub. Date: Dec. 16, 2010

(65) Prior Publication Data
US 2012/0139626 A1    Jun. 7, 2012

(30) Foreign Application Priority Data
Jun. 10, 2009   (DE) .......................... 10 2009 026 885

(51) Int. Cl.
*H03K 5/00*   (2006.01)
(52) U.S. Cl.
USPC ........................................................ 327/554
(58) Field of Classification Search
USPC ................................................. 327/551–559
See application file for complete search history.

(56) References Cited

U.S. PATENT DOCUMENTS

| | | | |
|---|---|---|---|
| 3,727,131 A | | 4/1973 | Puckette, IV |
| 3,835,399 A | * | 9/1974 | Holmes .......................... 327/555 |
| 4,292,468 A | * | 9/1981 | Yokoyama ....................... 330/85 |
| 4,314,288 A | * | 2/1982 | Gyi .................................. 360/65 |
| 4,383,230 A | | 5/1983 | Manzolini |
| 4,463,637 A | * | 8/1984 | Delio et al. ....................... 83/40 |
| 4,644,306 A | | 2/1987 | Kleinberg |
| 5,614,828 A | * | 3/1997 | Sims ............................ 324/402 |
| 7,639,071 B2 | | 12/2009 | Chang |
| 8,253,504 B2 | * | 8/2012 | Huang .................... 331/116 FE |

FOREIGN PATENT DOCUMENTS

DE      2 023 019       12/1970
WO  WO 2008/066552    6/2008

OTHER PUBLICATIONS

Tony R. Kuphaldt, Lessons in Electric Circuits, vol. II-AC Jul. 25, 2007, pp. 189-216.
H. Karasch et al, "Voltage Controlled Harmonic Filter", Motorola Technical Developments, Motorola Inc., Schaumburg, Illinois, Bd. 32, Sep. 1, 1997, pp. 37-40.

(Continued)

Primary Examiner — Dinh T. Le
(74) Attorney, Agent, or Firm — Bacon & Thomas, PLLC

(57) ABSTRACT

A low noise analog filter with adjustable filter frequency includes an oscillatory circuit, whose resonance frequency equals the filter frequency of the filter. The oscillatory circuit has a first circuit branch. One of the frequency determining elements is a capacitance and the other an inductance. The low noise analog filter further includes an amplifier with adjustable amplification installed in one of the two circuit branches. The output of the amplifier is connected with its inverting input via the frequency determining element arranged in such circuit branch. In filter operation, the amplifier amplifies, according to the adjusted amplification, a voltage applied across the frequency determining element arranged in such circuit branch and thereby effects a corresponding change of an electrical current flowing through such frequency determining element.

9 Claims, 8 Drawing Sheets

(56) References Cited

OTHER PUBLICATIONS

Ali Tombak et al., "Voltage-Controlled RF Filters Employing Thin-Film Barium Strontium Titanate Tunable Capacitors" IEEE Transactions on Microwave Theory and Techniques, IEEE Service Center, Pscataway, New Jersey, Bd. 51, Nr. 2, Feb. 1, 2003.
German Search Report, Feb. 2002.
International Search Report, Dec. 2011.

* cited by examiner

ANALOG FILTER WITH ADJUSTABLE FILTER FREQUENCY

TECHNICAL FIELD

The invention relates to an analog filter with adjustable frequency.

BACKGROUND DISCUSSION

There are a large number of electronic circuits, in which analog filters with adjustable frequency are applied. Examples of such a filter include bandpass filters with adjustable center frequency and band blocking filters with adjustable blocking frequency.

There are a large number of electronic circuits, in which analog filters with adjustable frequency are applied.

A typical example is circuits of measuring devices, in which these filters are used, for example, for filtering measurement signals registered with a sensor.

Among these are fill level measuring devices working with ultrasound, in the case of which ultrasonic sensors operated preferably at their resonance frequency transmit short ultrasonic wave pulses toward the fill substance and receive their echo signals reflected from the surface of the fill substance back to the sensor after a travel time dependent on the fill level. In such case, the sensor receives not only the wanted signal having the resonance frequency but also disturbance signals. The disturbance signals have, as a rule, disturbance frequencies different from the resonance frequency, and are suppressed by corresponding filtering. For this, a measurement signal is filtered out from the received signal of the sensor by means of a bandpass filter matched to the resonance frequency of the ultrasonic sensor. The resonance frequencies, however, differ from sensor to sensor and are, as a rule, dependent on temperature. In order to be able to cover the total range of possibly arising resonance frequencies, for example, bandpass filters are applied with a fixed center frequency and a very large bandwidth. In such case, disturbance signal suppression is, however, so much poorer, the larger the bandwidth of the bandpass filter.

Alternatively, adjustable bandpass filters are applied. An example is active bandpass filters with multiple cross coupling, in the case of which the center frequency is adjustable via changeable resistances. FIG. 1 shows an example of an embodiment for this. In such case, an input voltage $U_i$, referenced to a reference potential drops across a first resistor $R_1$ and a first capacitor C connected thereto in series to an inverting input of an amplifier $A_u$ with constant amplification. The non inverting input of the amplifier $A_u$ lies at the reference potential. An output signal of the amplifier $A_u$ is fed back via a second capacitor C of equal capacitance to a first node located between the first resistor $R_1$ and the first capacitor C and parallel thereto via a second resistor $R_2$ to a second node located between the first capacitor C and the inverting input. Additionally, the first node is connected via a third resistor $R_3$ to the reference potential. The output signal of this bandpass filter is the output voltage $U_o$ present at the output of the amplifier $A_u$ referenced to the reference potential. This filter exhibits, however, due to the resistances, a large amount of noise, which, exactly in the case of the filtering of measurement signals, such as they exist e.g. in the case of ultrasound fill-level measuring devices, is very disturbing.

In contrast, passive filters exhibit a very much smaller amount of noise. There is, however, the disadvantage that the filter frequency can be changed only by connecting, or disconnecting, inductances and capacitances determining the filter frequency, or through the use of mechanically adjustable inductances and capacitances. Such an adjustable filter is described in DE 10 2006 052 873 A1, for example.

Core of the filter described there is an LC oscillatory circuit, which includes an inductance and a detunable capacitance, especially a varactor diode. Varactor diodes have, however, small capacitances, e.g. on the order of magnitude of some picofarad, so that these filters are only suitable for filtering signals with very high frequencies.

SUMMARY OF THE INVENTION

It is an object of the invention to provide a low noise, analog filter with adjustable filter frequency.

For this, the invention resides in an analog filter with adjustable filter frequency including:
  an oscillatory circuit,
  whose resonance frequency equals the filter frequency of the filter,
  which has a first circuit branch, in which a first frequency determining element is arranged,
  which has a second circuit branch connected in parallel or in series with the first circuit branch, wherein a second frequency determining element is arranged in the second circuit branch, wherein
  one of the frequency determining elements is a capacitance and the other an inductance; and,
  installed in one of the two circuit branches, an amplifier with adjustable amplification,
  whose output is connected with its inverting input via the frequency determining element arranged in such circuit branch, and
  which, in filter operation, amplifies, according to the adjusted amplification, a voltage applied across the frequency determining element arranged in such circuit branch and thereby effects a corresponding change of an electrical current flowing through such frequency determining element.

In a first embodiment, the adjusted amplification is greater than 1 and the amplifier increases the electrical current flowing through the frequency determining element.

In a second embodiment, the adjusted amplification is less than 1 and the amplifier decreases the electrical current flowing through the frequency determining element.

In a first variant,
  the filter is a bandpass filter and the filter frequency is its center frequency, and
  the oscillatory circuit is a parallel oscillatory circuit, in which the first and the second circuit branch are connected in parallel Additionally, the invention includes a further development of the first variant, in the case of which
  in the other circuit branch likewise an amplifier with adjustable amplification is applied,
  whose output is connected with its inverting input via the frequency determining element arranged in such circuit branch, and
  which, in filter operation, amplifies, according to the adjusted amplification, a voltage applied across the frequency determining element arranged in such circuit branch and thereby effects a corresponding change of an electrical current flowing through such frequency determining element.

In a second variant,
  the filter is a band blocking filter and the filter frequency is its blocking frequency, and the oscillatory circuit is a series oscillatory circuit, in which the first and the second circuit branch are connected in series.

In an embodiment, an output signal of the filter is an output voltage, which falls across the oscillatory circuit.

In an additional embodiment, an input signal of the filter is an input voltage, which falls across a third circuit branch, which is connected in series in front of the oscillatory circuit and in which a resistor is arranged.

In another embodiment, an input signal of the filter is an input electrical current, a further circuit branch is placed in front of the oscillatory circuit, and the further circuit branch is connected in parallel with the oscillatory circuit and a resistor is arranged in the further circuit branch.

BRIEF DESCRIPTION OF THE DRAWINGS

The invention and other advantages will now be explained in greater detail based on the figures of the drawing, in which ten examples of embodiments are presented; equal elements are provided in the figures with equal reference characters. The figures of the drawing show as follows.

DETAILED DISCUSSION IN CONJUNCTION WITH THE DRAWINGS

Figure 2:
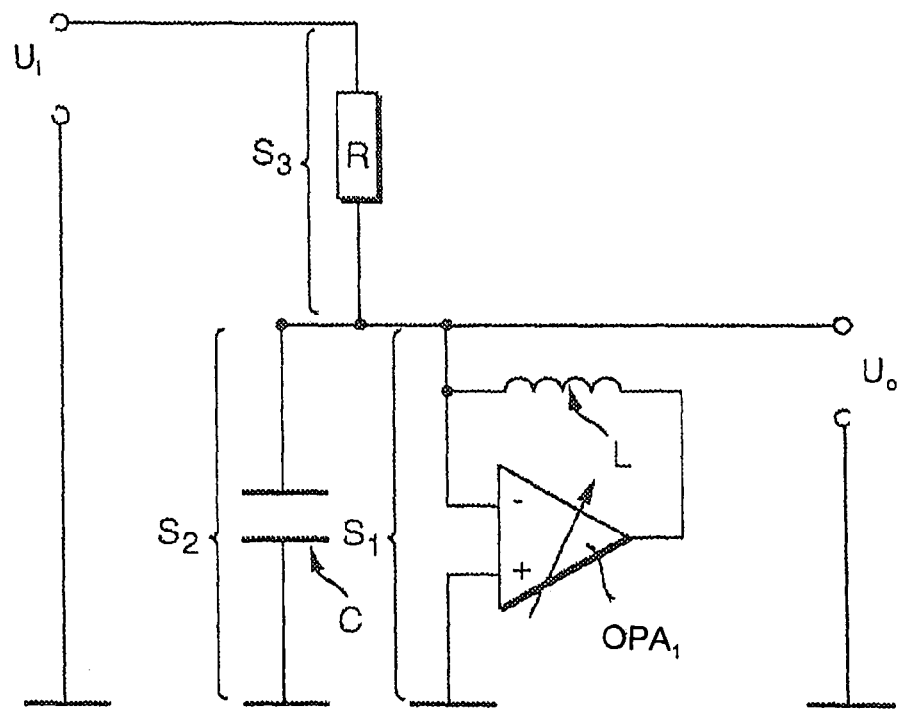
FIG. 2 is a first embodiment of a bandpass filter of the invention, with a parallel oscillatory circuit, in which a voltage applied across an inductance of the parallel oscillatory circuit is amplified by means of an adjustable amplifier and thereby effects a corresponding change of an electrical current flowing through the inductance.
Figure 3:
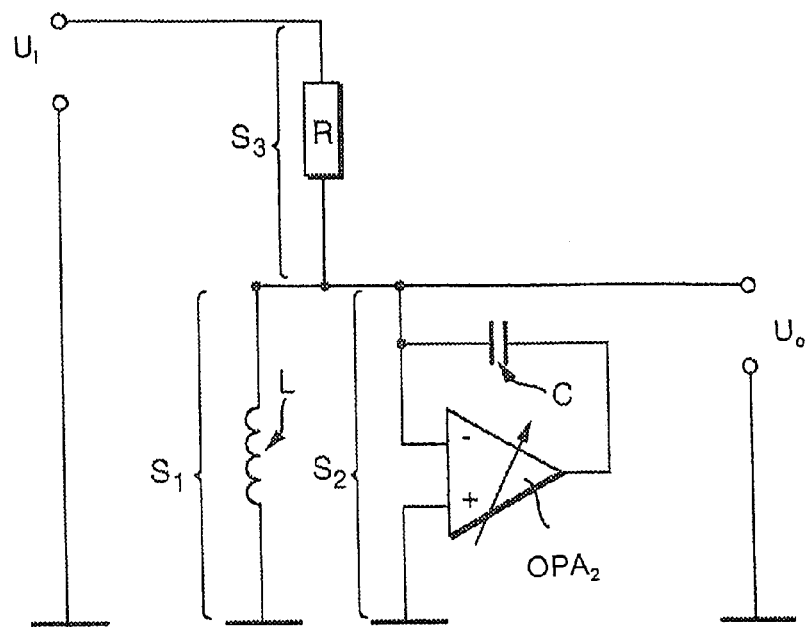
FIG. 3 is a second embodiment of a bandpass filter of the invention, with a parallel oscillatory circuit, in which a voltage applied across a capacitance of the parallel oscillatory circuit is amplified by means of an adjustable amplifier and thereby effects a corresponding change of an electrical current flowing through the capacitance.
Figure 4:
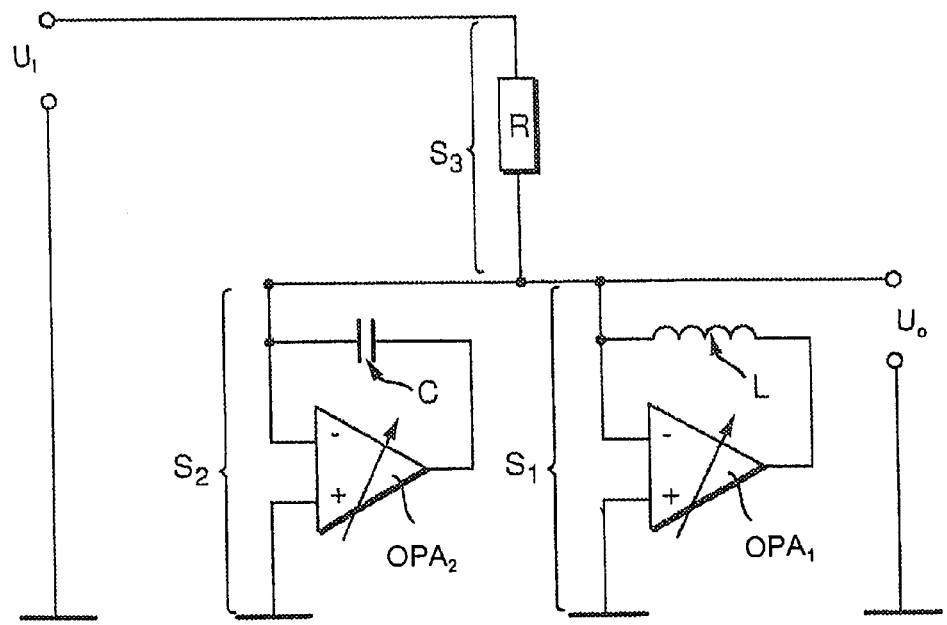
FIG. 4 is a third embodiment of a bandpass filter of the invention, with a parallel oscillatory circuit, in the case of which an amplifier is arranged in both circuit branches.

FIGS. 2, 3 and 4 show three examples of embodiments of a first variant of a passive analog filter of the invention with adjustable filter frequency.

The filters illustrated in these figures are bandpass filters and the filter frequency is the center frequency of the bandpass filter. Core of the filter is, in each case, an oscillatory circuit, whose resonance frequency $f_0$ equals the filter frequency of the respective filter. The oscillatory circuit includes two, parallel connected, circuit branches S1, S2, in which, in each case, a frequency determining element is arranged, of which one is an inductance L and one a capacitance C. In the here illustrated bandpass filters, the inductance L is arranged in the first circuit branch S1 and the capacitance C in the second circuit branch S2 connected in parallel with the first circuit branch S1.

Both circuit branches S1, S2 are connected on the input side to a third circuit branch S3, in which a resistor R is arranged. A input signal of the filter, here an input voltage $U_i$ referenced to a fixed reference potential, e.g. ground, falls across this third circuit branch S3 to the parallel oscillatory circuit. The second and the third circuit branch S2, 53 are likewise connected on the output side to this fixed reference potential. Provided at the output of the filter as the filtered output signal is the output voltage $U_o$ falling across the oscillatory circuit and referenced to the reference potential.

According to the invention, in one of the two circuit branches S1 or S2, an amplifier $OPA_1$, or, respectively, $OPA_2$ with adjustable amplification $A_L$, or $A_C$ is applied, whose output falls across the frequency determining element arranged in such circuit branch S1, S2 to its inverting input. The non inverting input of the amplifier $OPA_1$, or $OPA_2$ is connected to the reference potential. The amplifier $OPA_1$, or $OPA_2$, in filter operation, amplifies a voltage falling across the frequency determining element arranged in such circuit branch S1 or S2 according to the adjusted amplification $A_L$, or $A_C$ and effects thereby a corresponding change of an electrical current flowing through such frequency determining element. If the adjusted amplification $A_L$, or $A_C$ is greater than 1, then the electrical current flowing through the frequency determining element is increased by the amplifier $OPA_1$, or $OPA_2$. If the adjusted amplification $A_L$, or $A_C$ is less than 1, then the electrical current flowing through the frequency determining element is decreased by the amplifier $OPA_1$, or $OPA_2$.

The amplifiers $OPA_1$, and, respectively, $OPA_2$ are preferably operational amplifiers, whose amplification $A_L$, or $A_C$, is adjustable, for example, by means of a digital potentiometer symbolized here by an arrow.

In the case of the example of an embodiment illustrated in FIG. 2, the amplifier $OPA_1$ is applied in the first circuit branch S1 and connected to the inductance L. This combination of inductance L and amplifier $OPA_1$ acts therewith as an adjustable inductance $L_{eff}$ of size:

$$L_{eff} = \frac{L}{A_L + 1}$$

In this way, there results a resonance frequency $f_0$ of the parallel oscillatory circuit, adjustable via the amplification $A_L$, of:

$$f_0 = \frac{1}{2\pi\sqrt{\frac{LC}{A_L+1}}}$$

The center frequency of this bandpass filter equals the resonance frequency $f_0$ of this oscillatory circuit and is automatically adjustable based on the amplification $A_L$.

The bandwidth B of the bandpass filter illustrated in FIG. 2 is:

$$B = \frac{1}{2\pi RC}$$

The bandwidth B is therewith adjustable via the resistance R independently of the resonance frequency $f_0$ of the filter.

In the case of the example of an embodiment illustrated in FIG. 3, the amplifier $OPA_2$ is applied in the second circuit branch S2 and connected to the capacitance C. This combination of capacitance C and amplifier $OPA_2$ acts therewith as an adjustable capacitance $C_{eff}$ of size:

$$C_{eff} = C(A_C+1))$$

In this way, there results a resonance frequency $f_0$ of the parallel oscillatory circuit, adjustable via the amplification $A_C$, of:

$$f_0 = \frac{1}{2\pi\sqrt{LC(A_C+1)}}$$

The center frequency of this bandpass filter equals the resonance frequency $f_0$ of this oscillatory circuit and is automatically adjustable based on the amplification $A_C$.

The bandwidth B of the bandpass filter illustrated in FIG. 3 is:

$$B = \frac{1}{2\pi RC(A_C+1)}$$

The bandwidth B is therewith dependent on the resistance R and the resonance frequency $f_0$ of the filter.

In the case of the example of an embodiment illustrated in FIG. 4, there is applied in both the first circuit branch S1 as well as also in the second circuit branch S2, in each case, an amplifier $OPA_1$, $OPA_2$ with adjustable amplification $A_L$, $A_C$, whose output falls across the frequency determining element arranged in the respective circuit branch S1, S2 to its inverting input, and which, in filter operation, amplifies the voltage falling across the frequency determining element arranged in such circuit branch S1, S2 according to the adjusted amplification $A_L$, $A_C$ and thereby effects a corresponding change of the electrical current flowing through the particular frequency determining element. Also here, the electrical current increases, when the associated amplification $A_L$, and, respectively, $A_C$ is greater than 1, and it decreases, when the associated amplification $A_L$ and, respectively, $A_C$ is less than 1.

Therewith there results an adjustable inductance $L_{eff}$ of size:

$$L_{eff} = \frac{L}{A_L+1}$$

and an adjustable capacitance $C_{eff}$ of size:

$$C_{eff} = C(A_C+1))$$

Accordingly, there results via the amplifications $A_L$ and $A_C$ an adjustable resonance frequency $f_0$ of this parallel, oscillatory circuit of:

$$f_0 = \frac{1}{2\pi\sqrt{\frac{LC(A_C+1)}{A_L+1}}}$$

In this way, a clearly larger frequency range of the tunable filter frequencies can be covered. In such case, the amplifications $A_L$, $A_C$ are controlled in opposite directions, in order that their effects do not cancel one another.

The bandwidth B of the bandpass filter illustrated in FIG. 4 is:

$$B = \frac{1}{2\pi RC(A_C+1)}$$

Figure 5:
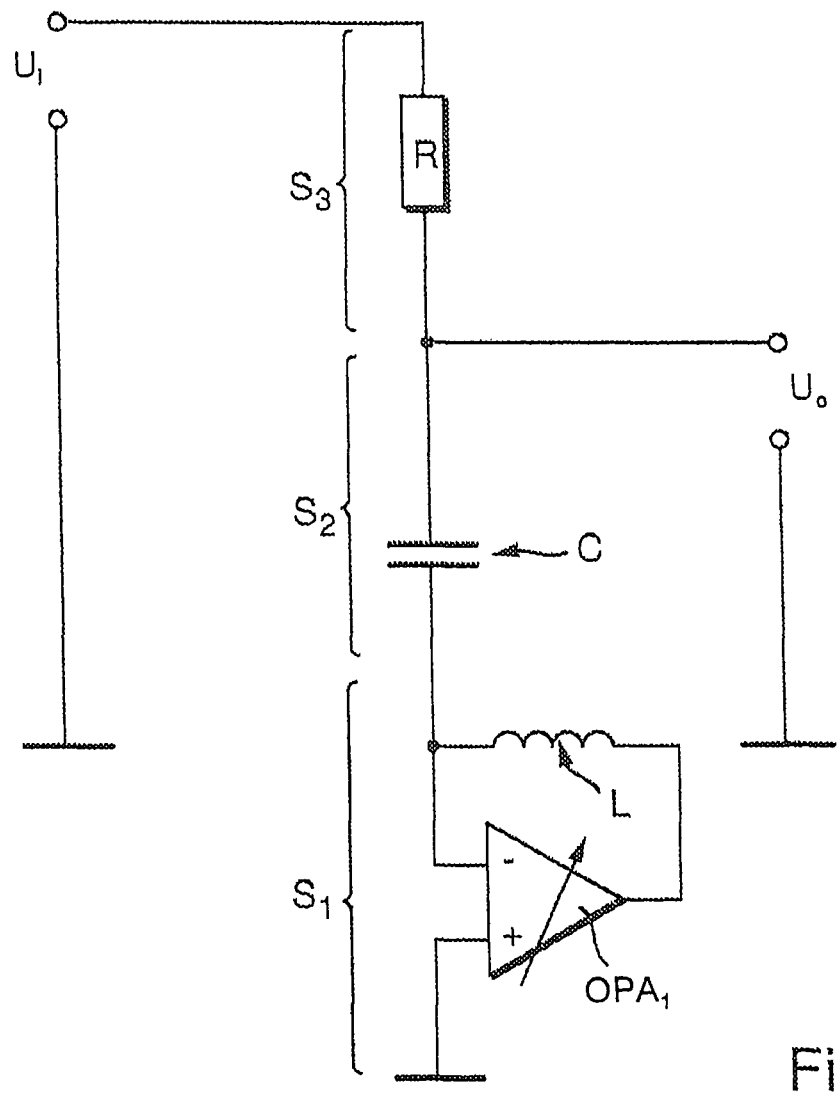
FIG. 5 is a first embodiment of a band blocking filter of the invention, with a series oscillatory circuit, in which a voltage applied across an inductance of the series oscillatory circuit is amplified by means of an adjustable amplifier and thereby effects a corresponding change of an electrical current flowing through the inductance.
Figure 6:
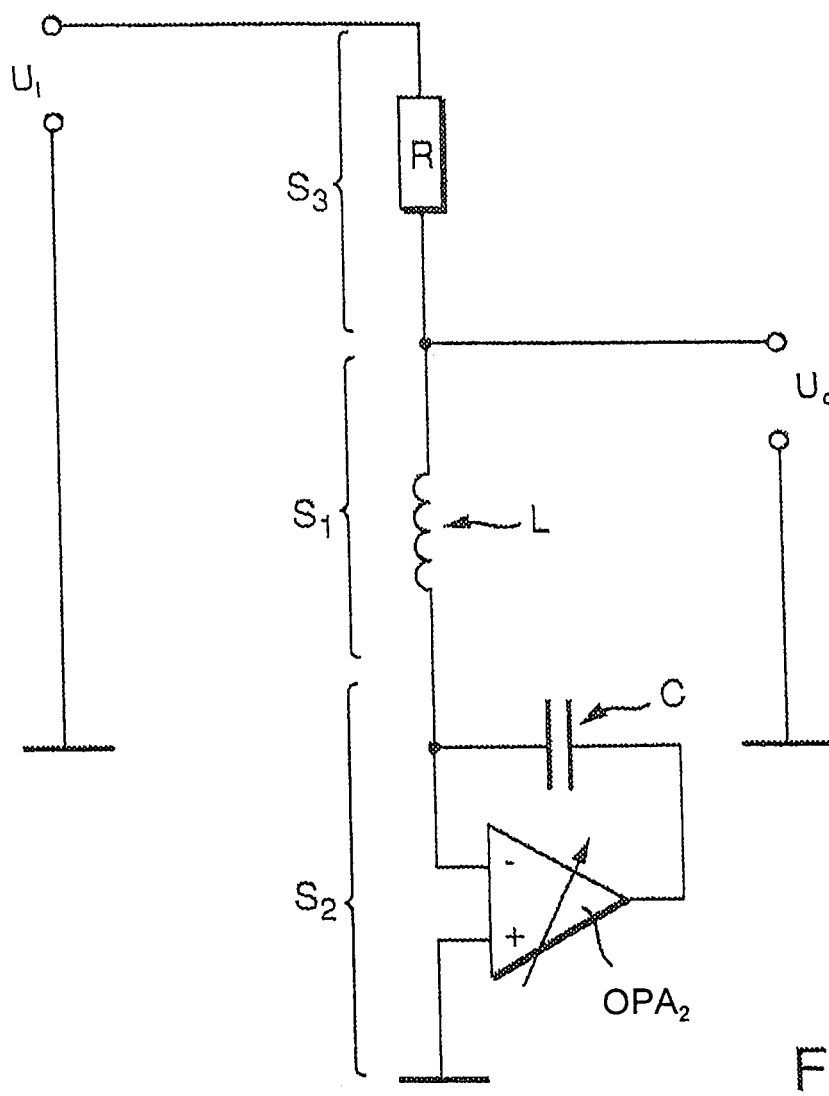
FIG. 6 is a second embodiment of a band blocking filter of the invention, with a series oscillatory circuit, in which a voltage applied across a capacitance of the series oscillatory circuit is amplified by means of an adjustable amplifier and thereby effects a corresponding change of an electrical current flowing through the capacitance.

FIGS. 5 and 6 show two examples of embodiments of a second variant of a passive analog filter of the invention with adjustable filter frequency. These illustrated filters are band blocking filters and the filter frequency is the blocking frequency of the band blocking filter. Core of the filter is also here, in each case, a oscillatory circuit, whose resonance frequency $f_0$ equals the filter frequency of the respective filter. In contrast to the earlier described examples of embodiments, the oscillatory circuit is here a series oscillatory circuit, which has two circuit branches S1, S2, which are connected in series with one another and in which, in each case, a frequency determining element is arranged, of which one is an inductance L and one a capacitance C. In the band blocking filters illustrated here, the inductance L is arranged in the first circuit branch S1 and the capacitance C in the second circuit branch 52 connected in series therewith.

Placed in front of the two, series arranged, circuit branches S1, S2 on the input side is a third circuit branch S3, in which a resistor R is arranged. The input signal of the filter is also here an input voltage $U_i$, which is referenced to a fixed reference potential, e.g. ground, and which falls across this third circuit branch S3 on the input side to lie against the series oscillatory circuit. The series oscillatory circuit lies on the output side likewise at this fixed reference potential and, at the output of the filter, the output voltage $U_o$ falling across the oscillatory circuit and referenced to the reference potential is available as the filtered output signal.

Also here, according to the invention, an amplifier $OPA_1$, $OPA_2$ with adjustable amplification $A_L$, $A_C$ is applied in one of the two circuit branches S1 or S2. The output falls across the frequency determining element arranged in such circuit branch S1, S2 to the inverting input of the respective amplifier $OPA_1$, $OPA_2$. The non inverting input of the amplifier $OPA_1$, and, respectively, $OPA_2$ is connected to the reference potential. The amplifier $OPA_1$, $OPA_2$, in filter operation, amplifies a voltage falling across the frequency determining element arranged in such circuit branch S1 or S2 according to the adjusted amplification $A_L$, or $A_C$ and effects thereby a corresponding change of the electrical current flowing through this element. If the adjusted amplification $A_L$ or $A_C$ is greater than 1, then the amplifier $OPA_1$, or $OPA_2$ increases the electrical current flowing through the frequency determining element. If the adjusted amplification $A_L$ or $A_C$ is less than 1, then the amplifier $OPA_1$, or $OPA_2$ decreases the electrical current flowing through the frequency determining element.

The amplifier $OPA_1$, $OPA_2$ is also here preferably an operational amplifier, whose amplification $A_L$, $A_C$ is adjustable, for example, by means of a digital potentiometer symbolized here by an arrow.

In the case of the example of an embodiment illustrated in FIG. 5, the amplifier $OPA_1$ is applied in the first circuit branch S1 and connected to the inductance L. This combination of inductance L and amplifier $OPA_2$ acts therewith as an adjustable inductance $L_{eff}$ of size:

$$L_{eff} = \frac{L}{A_L + 1}$$

In this way, there results a resonance frequency $f_0$ of the series oscillatory circuit, adjustable via the amplification $A_L$, of:

$$f_0 = \frac{1}{2\pi\sqrt{\frac{LC}{A_L+1}}}$$

The blocking frequency of this band blocking filter equals the resonance frequency $f_0$ of this oscillatory circuit and is automatically adjustable based on the amplification $A_L$.

With the resistor R connected in series with the series oscillatory circuit, the bandwidth B of the band blocking filter illustrated in FIG. 5 is:

$$B = \frac{R(A_L+1)}{2\pi L}$$

The bandwidth B is therewith dependent on the resistance R and the resonance frequency $f_0$ of the filter.

In the case of the example of an embodiment illustrated in FIG. 6, the amplifier $OPA_2$ is applied in the second circuit branch S2 and connected to the capacitance C. This combination of capacitance C and amplifier $OPA_2$ acts therewith as an adjustable capacitance $C_{eff}$ of size:

$$C_{eff} = C(A_C+1))$$

In this way, there results a resonance frequency $f_0$ of the series oscillatory circuit, adjustable via the amplification A, of:

$$f_0 = \frac{1}{2\pi\sqrt{LC(A_C+1)}}$$

The blocking frequency of this band blocking filter equals the resonance frequency $f_0$ of the series oscillatory circuit and is automatically adjustable based on the amplification $A_C$.

The bandwidth B of the bandpass filter illustrated in FIG. 6 is:

$$B = \frac{R}{2\pi L}$$

The bandwidth B is therewith adjustable via the resistance R independently of the resonance frequency $f_0$ of the filter.

Figure 7:
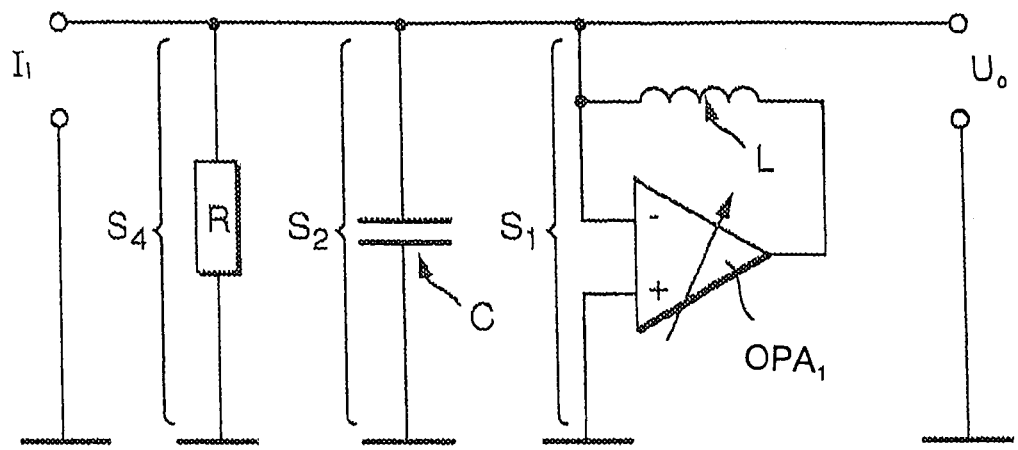
FIG. 7 is a filter of the invention according to FIG. 2 fed via an electrical current source.
Figure 8:
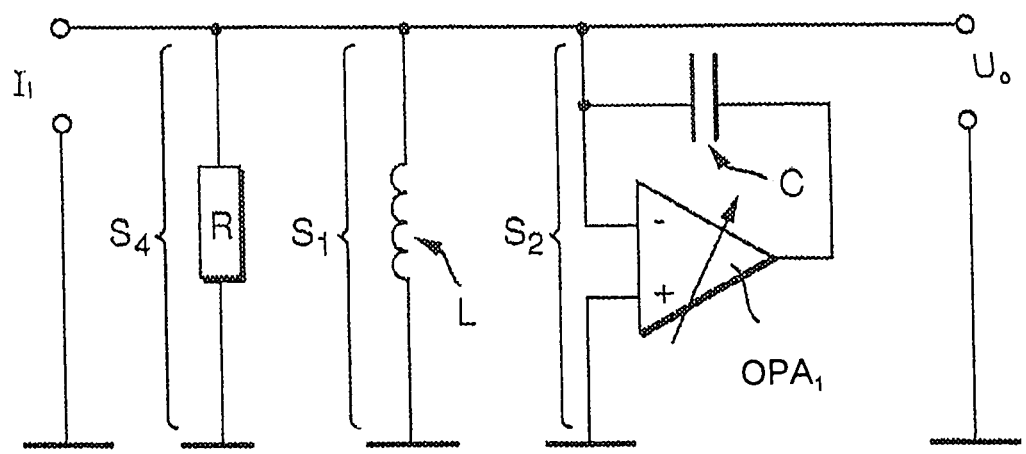
FIG. 8 is a filter of the invention according to FIG. 3 fed via an electrical current source.
Figure 9:
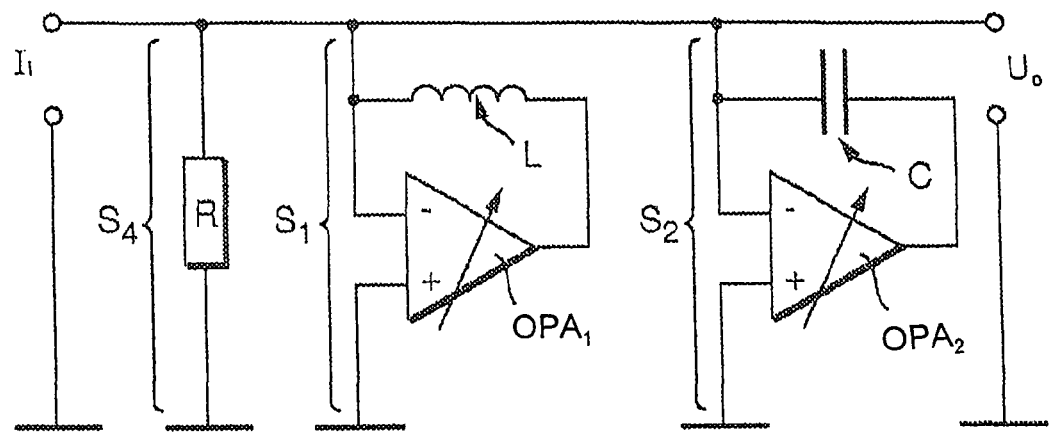
FIG. 9 is a filter of the invention according to FIG. 4 fed via an electrical current source.
Figure 10:
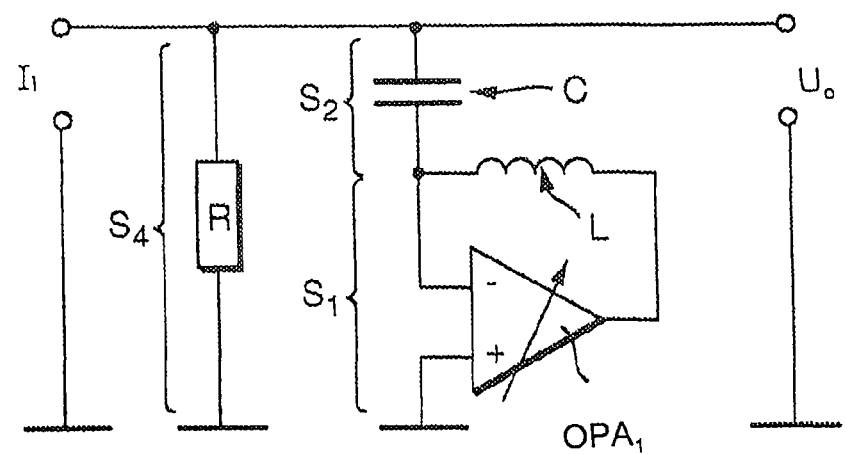
FIG. 10 is a filter of the invention according to FIG. 5 fed via an electrical current source.
Figure 11:
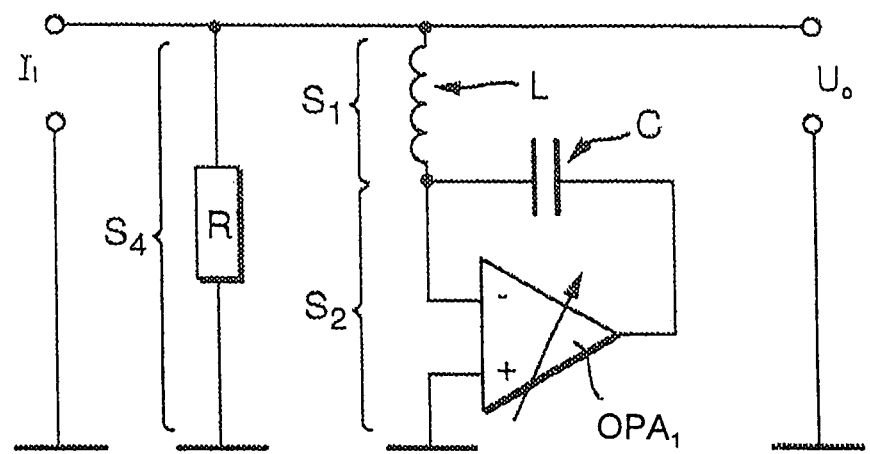
FIG. 11 is a filter of the invention according to FIG. 6 fed via an electrical current source.

Instead of an input voltage the analog filters of the invention can naturally also be fed an input electrical current $I_i$ as input signal. In such case, the third circuit branch S3 with the resistor R connected in series with the respective oscillatory circuit is absent. Instead, a further circuit branch S4 is placed in front of the respective oscillatory circuit. Circuit branch S4 is connected in parallel with the oscillatory circuit and contains a resistor R. This is shown in FIG. 7 using the example of the bandpass filter of FIG. 2, in FIG. 8 using the example of the bandpass filter of FIG. 3, in FIG. 9 using the example of the bandpass filter of FIG. 4, in FIG. 10 using the example of the band blocking filter of FIG. 5 and in FIG. 11 using the example of the band blocking filter of FIG. 6.

The formulas set forth above for the filters illustrated in FIGS. 2 to 6 for the adjustable inductance $L_{eff}$, adjustable capacitance $C_{eff}$, resonance frequency $f_0$ and bandwidth B of the respective filters hold analogously, wherein, in the above cited formulas, at the position of the resistance R connected in front in series in the third circuit branch S3 is placed the resistance R in the fourth circuit branch S4.

The filters of the invention have the advantage that, for adjusting the filter frequency, thus the center frequency of the bandpass filters, or the blocking frequency of the band blocking filters, only small amplifications $A_L$, $A_C$ are required. Furthermore, no adjustable resistances are required, and voltages falling across resistances, or electrical currents flowing therethrough, are not amplified. Accordingly, there is in the case of the filters of the invention also no amplification of the unavoidably arising noise of ohmic resistors. Correspondingly, the filters are characterized by extremely low noise, especially in comparison to active filters.

Figure 12:
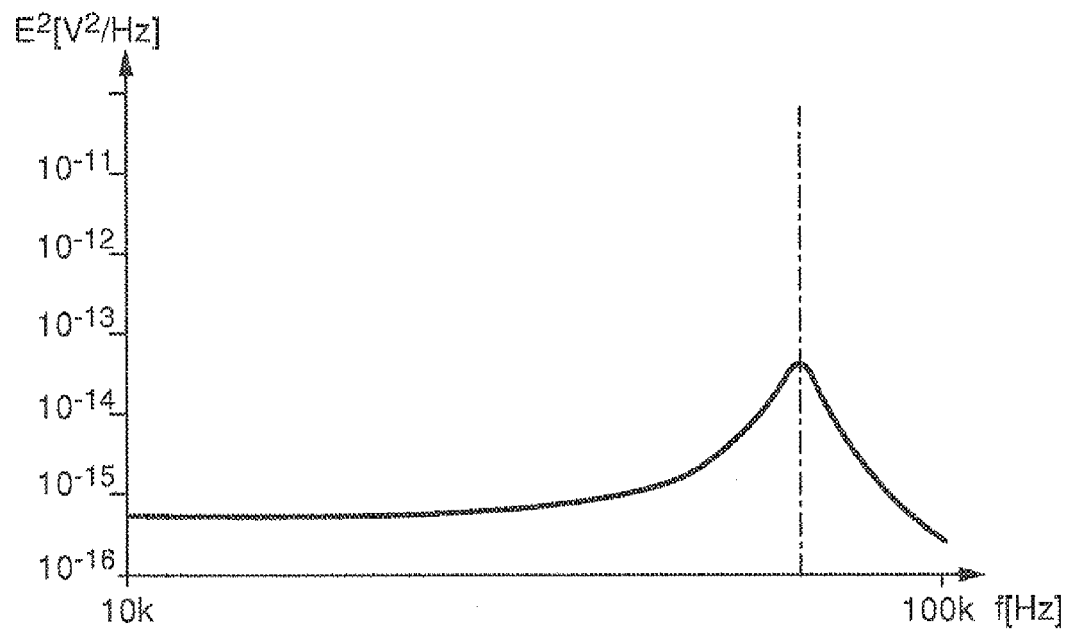
FIG. 12 shows the square of the spectral energy density of the noise of the passive bandpass filter of the invention illustrated in FIG. 2 as a function of frequency.

FIG. 12 shows, in a log-log graph, the square of the spectral energy density $E^2$, in $V^2/Hz$, of the noise, here of the voltage noise, of the passive bandpass filter of the invention illustrated in FIG. 2 as a function of frequency f in Hz over a frequency range of 10 kHz to 100 kHz.

Figure 1:
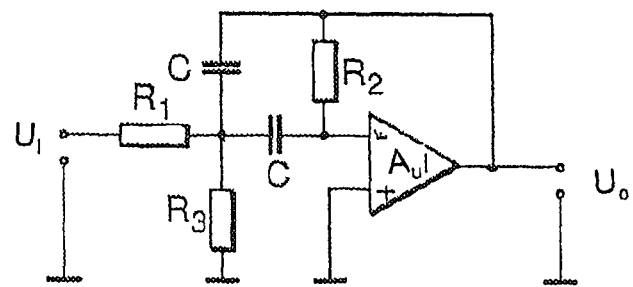
FIG. 1 is an active bandpass filter known from the state of the art and having multiple cross coupling.
Figure 13:
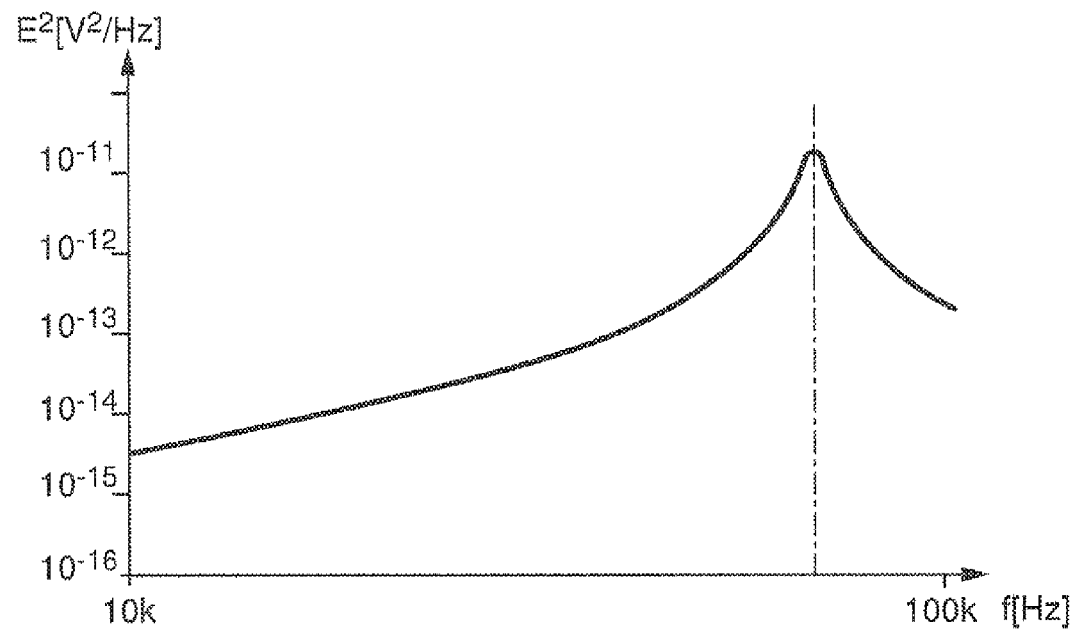
FIG. 13 shows the square of the spectral energy density of the noise of the conventional, active, bandpass filter illustrated in FIG. 1 as a function of frequency.

In the comparison thereto, FIG. 13 shows, likewise in a log-log graph, the square of the spectral energy density $E^2$, in $V^2/Hz$, of the noise, here of the voltage noise, of the conventional, active, bandpass filter illustrated in FIG. 1 as a function of frequency f in Hz over the same frequency range.

For this comparison, the two filters were designed in such a manner that they have the same center frequency and the same bandwidth. The two curves have, in each case, a marked maximum at the center frequency. As can be seen from the two FIGS. 12 and 13, the spectral energy density of the noise of the filter of the invention lies, over the entire illustrated frequency range, clearly below that of the conventional, active, bandpass filter. Especially, the difference in the relevant region of the center frequency in the illustrated comparison amounts to more than two powers of ten.

REFERENCE CHARACTERS $U_i$ input voltage
$U_o$ output voltage
$I_i$ input electrical current L inductance
C capacitance
$S_1$ first circuit branch
$S_2$ second circuit branch
$S_3$ third circuit branch
$S_4$ further circuit branch
$OPA_1$ amplifier
$OPA_2$ amplifier
R resistor, resistance

The invention claimed is:

1. An analog filter with adjustable filter frequency, comprising:
an oscillatory circuit with a resonance frequency that equals the filter frequency of the filter, said oscillatory circuit comprises a first circuit branch, in which a first frequency determining element is arranged and a second circuit branch connected in parallel or in series with said first circuit branch, wherein a second frequency determining element is arranged in said second circuit branch, said first frequency determining element is a capacitance and said second frequency determining element is an inductance; and,
an amplifier installed in the first or in the second circuit branch, whose output is connected with its inverting input via said frequency determining element arranged in said circuit branch, in which said amplifier is installed wherein:
said amplifier amplifies, a voltage applied across one of said frequency determining elements, and thereby effects a corresponding change of an electrical current flowing through such frequency determining element, which changes the resonance frequency and therefore the filter frequency.

2. The analog filter as claimed in claim 1, wherein:
said amplifier increases the electrical current flowing through the frequency determining element by adjusting the amplification of the amplifier greater than 1.

3. The analog filter as claimed in claim 1, wherein:
said amplifier decreases the electrical current flowing through the frequency determining element, by adjusting the amplification of the amplifier than 1.

4. The analog filter as claimed in claim 1, wherein:
the filter is a bandpass filter and the filter frequency is its center frequency; and
said oscillatory circuit is a parallel oscillatory circuit, in which said first and said second circuit branch are connected in parallel.

5. The analog filter as claimed in claim 4, wherein:
in said first circuit branch a second amplifier with adjustable amplification is installed, whose output is connected with its inverting input via the frequency determining element arranged in such circuit branch, and which, in filter operation, amplifies, a voltage applied across said frequency determining element arranged in the circuit branch, in which said second amplifier is installed, according to the adjusted amplification, and thereby effects a corresponding change of an electrical current flowing through such frequency determining element.

6. The analog filter as claimed in claim 1, wherein:
the filter is a band-stop filter and the filter frequency is its limiting frequency; and
said oscillatory circuit is a series oscillatory circuit, in which said first and said second circuit branch are connected in series.

7. The analog filter as claimed in claim 1, wherein:
an output signal of the filter is an output voltage across the oscillatory circuit.

8. The analog filter as claimed in claim 1, wherein:
an input signal of the filter is an input voltage, which drops across a third circuit branch, which is connected in series in front of said oscillatory circuit and in which a resistor is arranged.

9. The analog filter as claimed in claim 1, wherein:
an input signal of the filter is an input electrical current; and
a further circuit branch is placed in front of said oscillatory circuit, and said further circuit branch is connected in parallel with the oscillatory circuit, and contains a resistor.

* * * * *